(12) United States Patent
Sarin et al.

(10) Patent No.: US 7,161,844 B2
(45) Date of Patent: Jan. 9, 2007

(54) METHOD AND APPARATUS FOR COMPENSATING FOR BITLINE LEAKAGE CURRENT

(75) Inventors: Vishal Sarin, Cupertino, CA (US); Hieu Van Tran, San Jose, CA (US); Dana Lee, Santa Clara, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/814,443

(22) Filed: Mar. 30, 2004

(65) Prior Publication Data

US 2005/0219914 A1    Oct. 6, 2005

(51) Int. Cl.
*G11C 7/10* (2006.01)

(52) U.S. Cl. ............................ 365/189.01; 365/189.02; 365/230.01

(58) Field of Classification Search ............ 365/189.01, 365/189.02, 230.01, 185.19
See application file for complete search history.

(56) References Cited

U.S. PATENT DOCUMENTS 6,046,932 A * 4/2000 Bill et al. ............... 365/185.02
6,275,415 B1 * 8/2001 Haddad et al. ......... 365/185.11

* cited by examiner

*Primary Examiner*—Van Thu Nguyen
*Assistant Examiner*—Pho M. Luu
(74) *Attorney, Agent, or Firm*—DLA Piper US LLP (57) ABSTRACT

A bitline leakage current compensation circuit for compensating for leakage current in an operational memory array by measuring the leakage current in a non-operational memory array or a dummy memory array and providing a feedback signal to a current source or providing the compensation current.

9 Claims, 10 Drawing Sheets

METHOD AND APPARATUS FOR COMPENSATING FOR BITLINE LEAKAGE CURRENT

FIELD OF THE INVENTION

This invention relates to memory systems, and more particularly memory systems that compensate for bitline leakage current.

BACKGROUND OF THE INVENTION

Memory systems include memory arrays that typically include memory cells arranged in rows and columns with a plurality of bitlines. Each bitline is coupled to at least a portion of a column of memory cells. The bitline typically has a parasitic leakage current that impacts programming efficiency and the charge pump current. The bitline leakage current is a function of the voltage on the bitline.

SUMMARY OF THE INVENTION

In one aspect, a method is for programming a memory cell. An incremental current is applied to bitlines of selected memory cells during programming of the selected memory cells. The incremental current is substantially equal to leakage current on the bitlines.

In another aspect, a method is for compensating for bitline leakage in a memory system. A first voltage is detected on a bitline in a first memory array. A second voltage is applied to a bitline in a second memory array. The second voltage has substantially the same amplitude as the first voltage. A leakage current is detected on the bitline of the second memory array. An incremental current substantially equal to the detected current during programming of the first memory array is applied to the bitlines of the first memory array.

A memory comprises a plurality of memory arrays. Each memory array includes a plurality of memory cells and includes a plurality of bitlines. Each of the plurality of bitlines is coupled to a corresponding group of the plurality of memory cells. A first circuit has an input coupled to a bitline of a first one of the memory arrays and has an output coupled to a bitline of a second one of the memory arrays to apply a voltage on the bitline of the second memory array equal to a voltage on the bitline of the first memory array during programming of the first memory array. A second circuit is coupled to the bitline of the second memory array to measure current on the bitline. A current source is coupled to the bitline of the first memory array to provide a current thereto in response to the detected current on the bitline of the second memory array. The first memory array may be an operational memory array and the second memory array may be a non-operational memory array.

DETAILED DESCRIPTION

A memory system provides tracking of and compensation for bitline leakage current from unselected memory cells.

Figure 1:
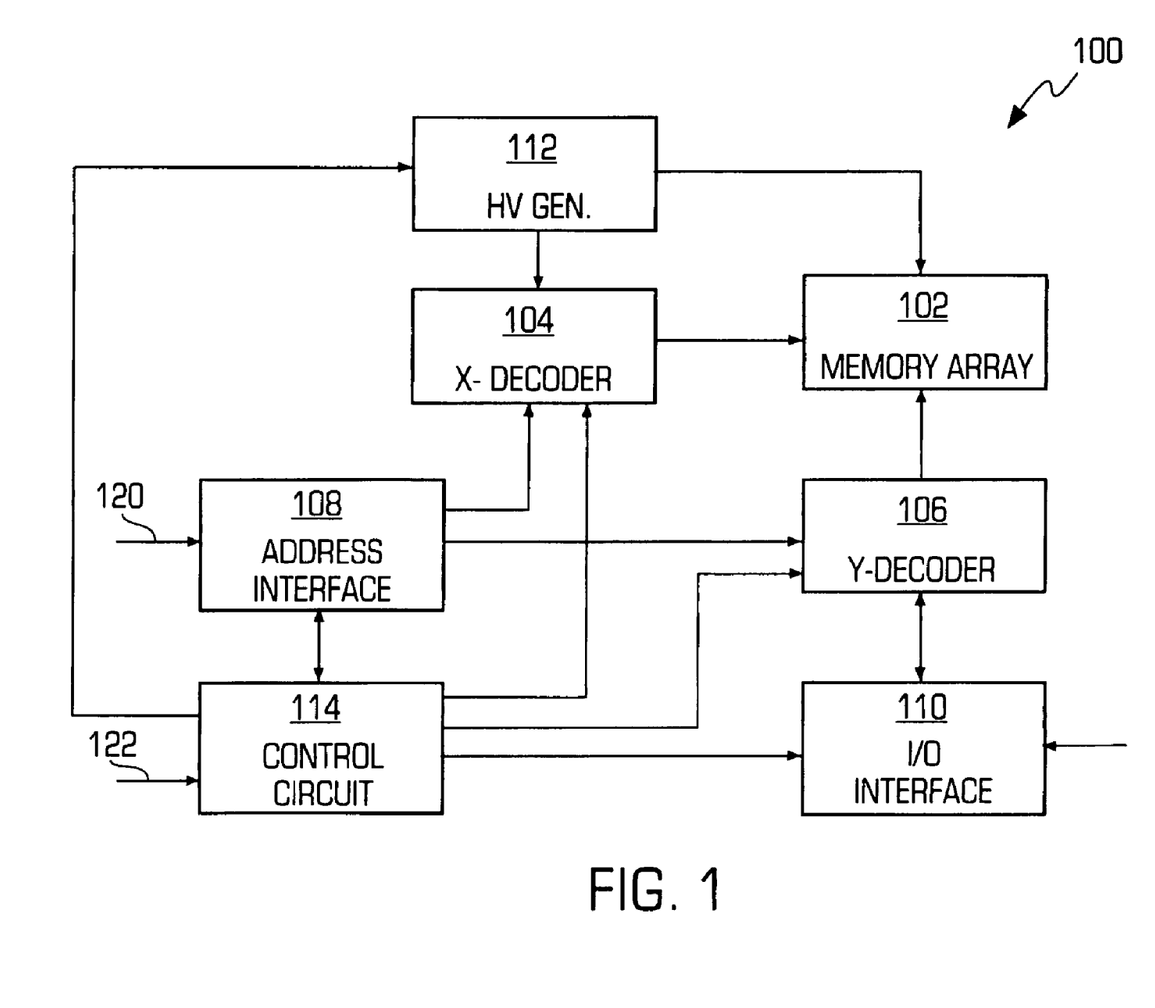
FIG. 1 is a block diagram illustrating a memory system.

FIG. 1 is a block diagram illustrating a memory system 100. The memory system 100 comprises a memory array 102, an x-decoder 104, a y-decoder 106, an address interface 108, an input/output (I/O) interface 110, a high voltage generator 112, and a control circuit 114.

The memory array 102 comprises an array of memory cells (not shown) arranged in rows and columns and an array of redundant memory cells (not shown) arranged in rows and columns. The memory array 102 may be, for example, a static random access memory, a dynamic random access memory, or a flash memory. The flash memory may include, for example, non-volatile floating gate memory cells. See, for example, U.S. Pat. No. 5,289,411, which is incorporated herein by reference. Non-volatile floating gate memory cells, arranged in an array of a plurality of rows and columns are well known in the art. One example of a type of non-volatile floating gate memory cell is a source side injection memory cell. See, for example, the memory cell disclosed in U.S. Pat. No. 5,572,054 which is incorporated herein by reference. The memory array 102 further includes sense amplifiers (not shown) for detecting contents stored in the memory array 102.

Columns of cells of the memory array 102 are coupled to corresponding bitlines. Rows of memory cells of the memory array 102 are coupled to corresponding source lines and corresponding word lines. Unselected memory cells on a bitline may have a leakage current during programming of selected memory cells on bitline. The memory array 102 may include bitline leakage current compensation circuits, such as, the memory systems described below in conjunction with FIGS. 2–10, to compensate for the bitline leakage current. Leakage current on the bitline during programming causes the high voltage generator 112 to provide a current so that the cell current during the program equals the bias current used to program the cell and an additional parasitic bitline leakage current.

The parasitic bitline leakage current is undesirable because the parasitic leakage current is not a constant current and may cause the programming efficiency to modulate from a desired level established by a bias current, thereby effect the programming accuracy. Multilevel cell memories use higher programming accuracy because of the smaller ranges of voltages that define the contents stored in the cell. The parasitic bitline leakage current is further undesirable because the parasitic bitline leakage current increases the load and size on the high voltage generator that then provides the bitline leakage current. It is therefore desirable to isolate the bitline leakage from the current through the cell while programming the cell. Because the bitline leakage varies with process and temperature, estimates of the bitline leakage current are less accurate than if directly measured. The bitline leakage current compensation circuits described below measures bitline leakage current in real time and provide bitline leakage compensation current based on the measured bitline leakage current. The bitline leakage current compensation current may measure the leakage from a non-operational bitline or a dummy bitline in real time.

The address interface 108 comprises buffers and latches for address signals 120 and provides decoded row and column addresses to the x-decoder 104 and the y-decoder 106. The I/O interface 110 comprises buffers and data latches for communicating data with the memory array 102.

The high voltage generator 112 generates the high voltage signals for altering the contents of the memory cells of the memory array 102. The high voltage generator 112 provides a programming voltage signal to the memory array 102 to program selected memory cells, and provides an erase voltage signal to the memory array 102 to erase selected memory cells. The high voltage generator 112 receives control signals from the control circuit 114 for controlling the generation and application of the high voltage signals, the programming voltage signal and the erase voltage signal. The high voltage generator 112 may include a charge pump and high voltage regulators.

The control circuit 114 provides control signals to the x-decoder 104, the y-decoder 106, the address interface 108, the input/output (I/O) interface 110, and the high voltage generator 112 for controlling the memory system 100. The control circuit 114 controls alteration of the contents of the memory array 102 through writing and erasing of the memory cells and controls reading of the memory array 102 in response to the address signals 120 and control signals 122.

In one embodiment, the memory array includes a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

Figure 2:
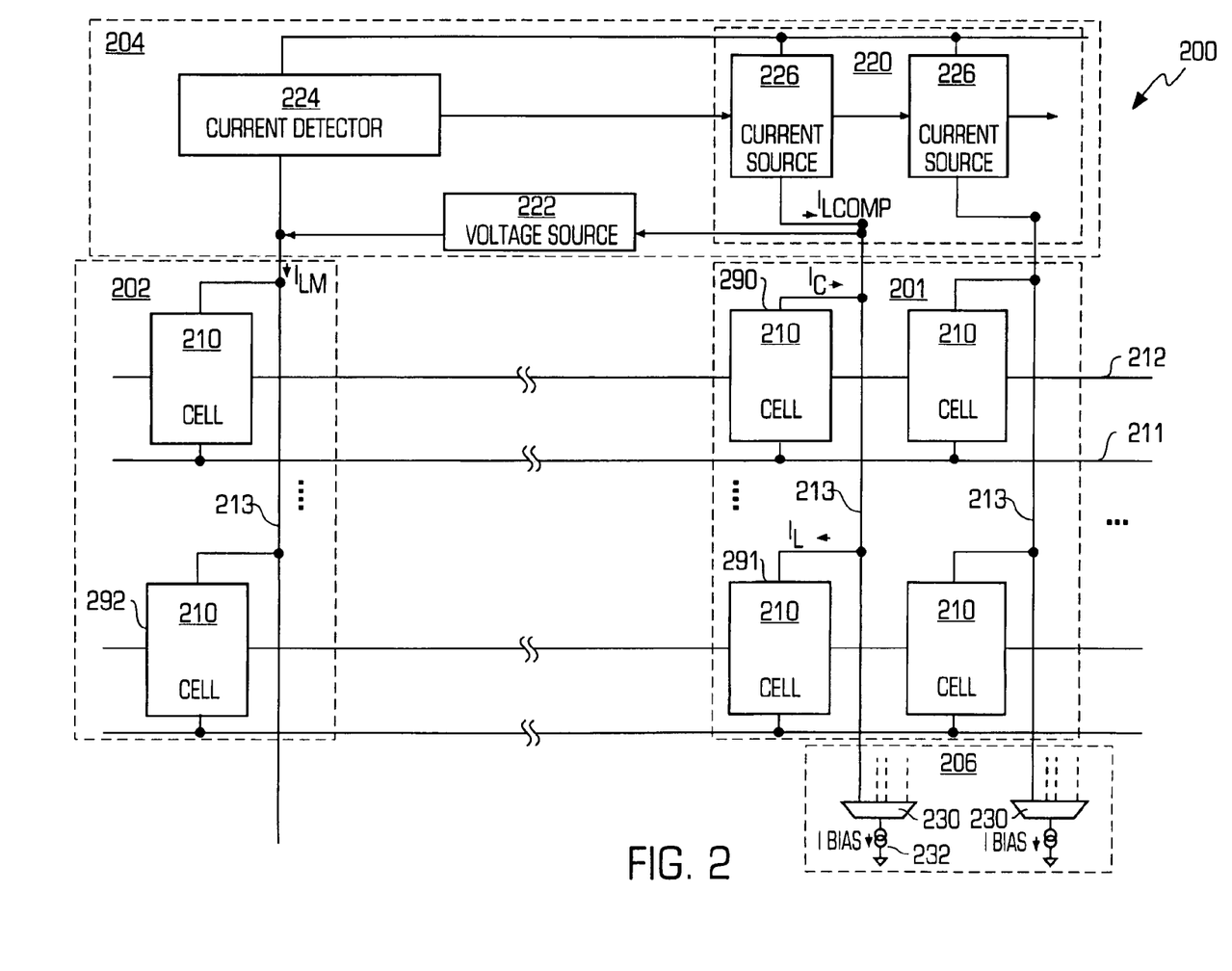
FIG. 2 is a block diagram illustrating a memory system that includes a bitline leakage current compensation circuit.

FIG. 2 is a block diagram illustrating a memory system 200.

The memory system 200 comprises a first memory array 201, a second memory array 202, a bitline leakage current compensation circuit 204, and a column multiplexer circuit 206. Only memory arrays 201 and 202 are shown for simplicity, but the memory system 200 may include more than two memory arrays. The memory arrays 201 and 202 comprise a plurality of memory cells 210 that may be arranged in rows and columns. Rows of memory cells 210 are coupled to a corresponding source line 211 and a corresponding word line 212. Columns of memory cells 210 are coupled to a corresponding bitline 213.

The bitline leakage current compensation circuit 204 comprises a current source 220, a voltage source 222, and a current detector 224. The current source 220 comprises a plurality of current sources 226 that are coupled to a corresponding bitline 213 of the first memory array 201.

The column multiplexer circuit 206 comprises a plurality of multiplexers 230 and a plurality of bias current sources 232. Each multiplexer 230 is coupled to a plurality of bitlines 213 which are selectively biased by a corresponding bias current source 232. In an alternative embodiment, the bias current source 232 may be coupled to the bitline 213 on the input side of the multiplexer 230. In another embodiment, the bias current source 232 may be coupled to the selected bit lines 213 after the multiplexer 230 or on the output side of the multiplexer 230.

The bitline leakage current circuit 204 provides a current $I_{COMP}$ to the bitlines of the first memory array 201 to compensate for leakage current from unselected memory cells 210. In one embodiment, the bitline leakage current compensation circuit 204 provides a current $I_{COMP}$ that is predetermined as an estimate of the bitline leakage current. In another embodiment, the bitline leakage current compensation circuit 204 provides a current $I_{COMP}$ that is determined based on a measured estimate of the bitline leakage current. The bitline leakage current compensation circuit 204 uses the second memory array 202 to provide an estimate of the bitline leakage current of the first memory array 201 based on a measurement of the leakage current of the second memory array 207. The bitline leakage current compensation circuit 204 may set the voltage on a bitline 213 of the second memory array to be equal to the voltage on the bitline 213 of the first memory array 201. In one embodiment, a memory cell 290 of the first memory array 201 is a selected memory cell. For clarity only one memory cell is labeled 290 although multiple memory cells along a word line 212 will be selected. An unselected memory cell 291 coupled to the same bitline 213 as the selected memory cell 290 has a leakage current $I_L$. An unselected cell 292 in the second memory array 202 draws a leakage current $I_{LM}$ on the bitline 213. In one embodiment, the second memory array 202 is a dummy memory array that is not used for storing data. In another embodiment, the second memory array 202 is a memory array that currently is nonoperational or is not currently being programmed.

During programming, the high voltage generator 112 (FIG. 1) applies a high voltage to the source line 211 of memory cells 210 that are enabled by the word line 212. During programming, the memory cells 210 that are selected (memory cells 290) draw a cell current $I_c$, and also unselected memory cells 210 (memory cells 291) draw a leakage current $I_L$. Also the bias current source 232 associated with the bitline 213 draws a bias current Ibias.

Without compensation the cell current $I_C$ of a selected memory cell 210 equals $$I_C = I\text{bias} + I_L \qquad (1)$$

in which the current Ibias is the current of the of the bias source 232 and the leakage current $I_L$ is the leakage current of an unselected memory cell 210 on the bitline 213.

The bitline leakage current compensation circuit 204 applies a compensation current $I_{LCOMP}$ to the bitline 213 so that the cell current $I_C$ is $$I_C = Ibias + I_L - I_{LCOMP} \quad (2)$$

In one embodiment, the leakage compensation current $I_{LCOMP}$ is predetermined as an estimate of the expected leakage current.

In another embodiment, the leakage compensation current $I_{LCOMP}$ is determined from a measured or detected leakage current of another bitline 213 (such as a bitline 213 in the second memory array 202), and the current source 220 provides a feedback current $I_{LFB}$ which is an approximation of the measured leakage current $I_{LM}$, to the bitline 213 of the first memory array 201. In this embodiment the leakage current $I_L$ is $$I_L \approx I_{LFB} \approx I_{LM} \quad (3)$$

because the measured leakage current $I_{LM}$ approximates the leakage current $I_L$ and as $$I_{COMP} \approx I_L \approx I_{LFB} \quad (4).$$

Thus the cell current $I_C$ calculated by equation (2) becomes $$I_C = Ibias \quad (5)$$

from combining equations (2) and (4).

The current source 226 provides a leakage compensation current $I_{LFB}$ to a bitline 213. In one embodiment, the leakage compensation current $I_{LFB}$ is approximately equal to the leakage current IL of the unselected memory cell 210. In another embodiment, the current source 226 provides a leakage compensation current ILFB that is measured from the leakage current of an unselected memory cell 210.

The voltage source 222 measures the voltage on the bitline 213 of the first memory array 201 (e.g., the operational array) and applies this voltage to the bitline 213 of the second memory array 202 (e.g., a non-operational array or a dummy array). The second memory array 202 may be a memory array that is used for storing content or alternatively may be a dummy memory array that is not used for storing content. Because none of the memory cells 210 in the second memory array 202 have been selected, the unselected memory cell 210 of the first memory array 201 corresponding to the row of the selected memory cell 210 of the first memory array 201 draws a leakage current $I_{LM}$.

The current detector 224 measures the bitline leakage current $I_{LM}$ and provides a signal to the current sources 226 to control the current sources 226 to generate a current ILFB that is substantially equal to the leakage current $I_{LM}$. In one embodiment, the current sources 226 are current mirror devices for mirroring the current measured by the current detector 224. The bitline leakage current compensation circuit 204 detects the voltage on the bitline 213 of the first memory array 201 and in real time controls the voltage on the bitline 213 of the second memory array 202. The current detector 224 detects in real time the leakage current on the bitline 213 of the second memory array 202 and controls the current source 220 in real time to provide a compensation current to the bitline 213 of the first memory array 201.

Figure 3:
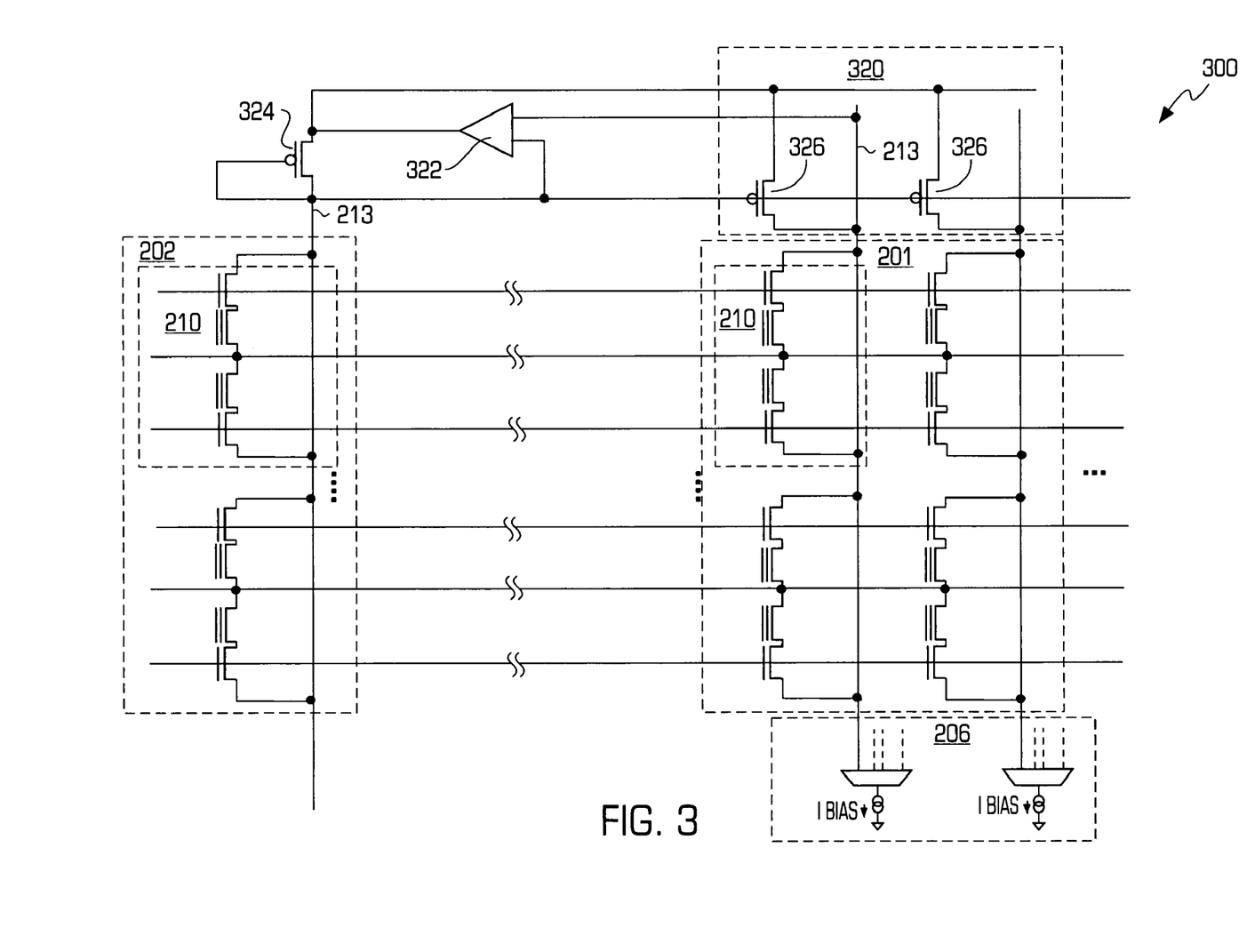
FIG. 3 is a block diagram illustrating a first embodiment of the memory system of FIG. 2.

FIG. 3 is a block diagram illustrating a memory system 300.

The memory system 300 illustrates one embodiment of the memory system 200 (FIG. 2) that compensates for systematic bitline leakage current (e.g., the bitline leakage current is substantially equal for all bitlines 213 in the first memory array 201). The memory system 300 comprises a first memory array 201, a second memory array 202, a column multiplexer circuit 206, a current source 320, an operational amplifier 322, and a PMOS transistor 324.

The operational amplifier 322 functions as a voltage controller in a similar manner as the voltage source 222 of the memory system 200 (FIG. 2). First and second inputs of the operational amplifier 322 are coupled to the bitlines 213 of the first memory array 201 and the second memory array 202, respectively. The output of the operational amplifier 322 is coupled to the source of the PMOS transistor 324. The PMOS transistor 324 functions in a similar manner as the current detector 224 of the memory system 200 (FIG. 2). The diode connected PMOS transistor 324 is coupled to the bitline 213 of the second memory array 202 for detecting the leakage current on the bitline 213 of the second memory array 202. The operational amplifier 322 detects the voltage on the bitline 213 of the first memory array 201 during a programming event and controls the source of the PMOS transistor 324 so that the voltage on the drain of the PMOS transistor 324 and the bitline 213 of the second memory array 202 is substantially equal to the voltage measured on the bitline 213 of the first memory array 201 in real time.

The current source 320 comprises a plurality of PMOS transistors 326 that are coupled to a respective bitline 213 of the first memory array 201. The gates of the PMOS transistors 326 are coupled to the drain of the PMOS transistor 324 to mirror the current of the PMOS transistor 324 and thus to mirror the leakage current of the bitline 213 of the second memory array 202.

In an alternative embodiment, the current source 320 and the PMOS transistor 324 may be arranged on the output side of the column multiplexer 230.

In another embodiment, NMOS transistors may be used for transistors 324 and 326.

Figure 4:
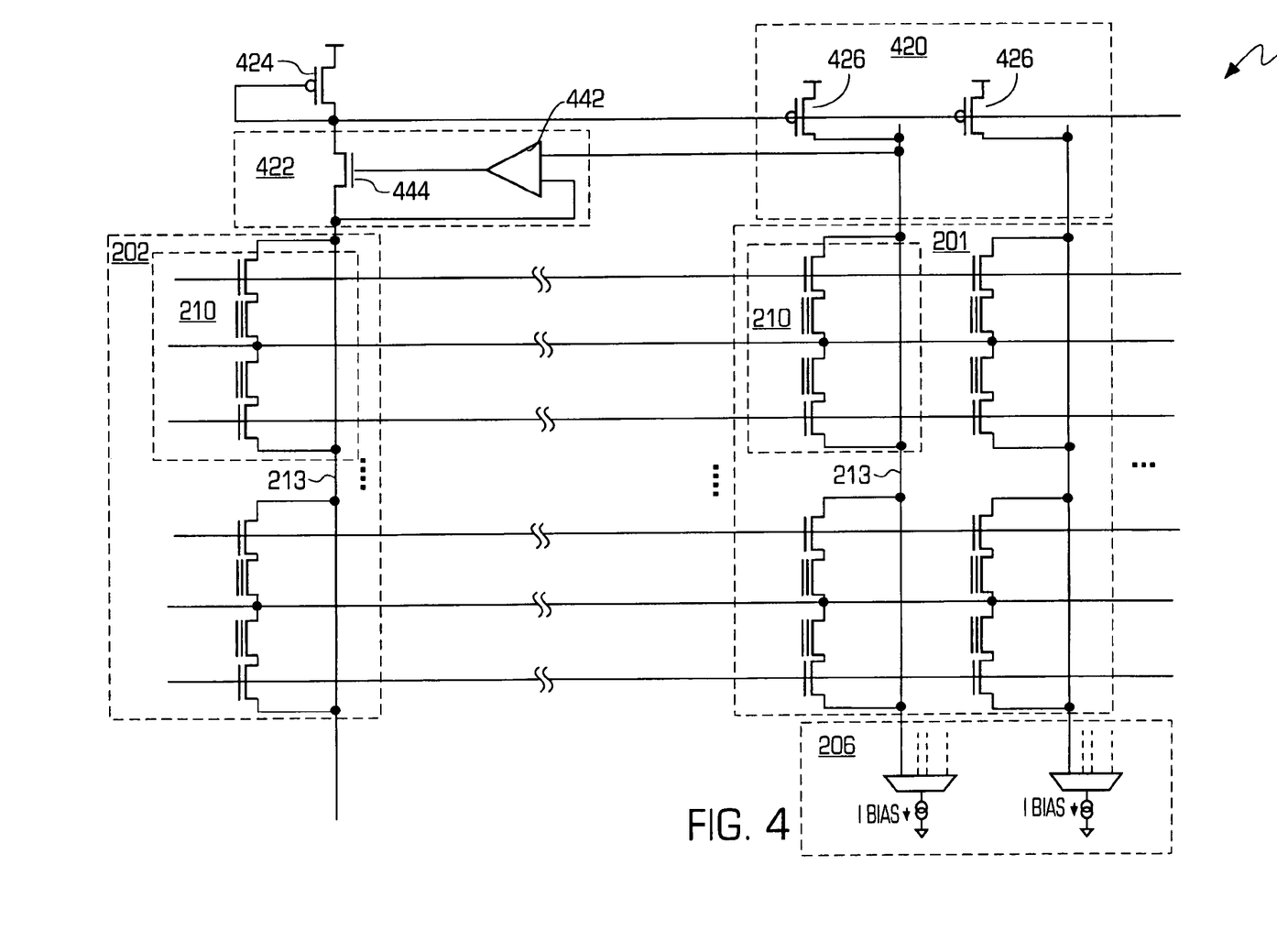
FIG. 4 is a block diagram illustrating a second embodiment of the memory system of FIG. 2.

FIG. 4 is a block diagram illustrating a memory system 400.

The memory system 400 illustrates another embodiment of the memory system 200 (FIG. 2) that compensates for systematic bitline leakage current. The memory system 400 comprises a first memory array 201, a second memory array 202, a column multiplexer circuit 206, a current source 420, a voltage source 422, and a PMOS transistor 424. The current source 420, the voltage source 422, and the PMOS transistor 424 function in a similar manner as the current source 220, the voltage source 222, and the current detector 224, respectively, of the memory system 200 (FIG. 2). The voltage source 422 comprises an operational amplifier 442 and a NMOS transistor 444. First and second inputs of the operational amplifier 442 are coupled to the bitlines 213 of the first memory array 201 and the second memory array 202, respectively. The output of the operational amplifier 442 is coupled to the gate of the NMOS transistor 444. The drain-source terminals of the NMOS transistor 444 are coupled between the drain of the PMOS transistor 424 and the bitline 213 of the second memory array 202. The operational amplifier 442 controls the gate of the NMOS transistor 444 as a source follower so that the voltage on the source of the NMOS transistor 444 and thus on the bitline 213 of the second memory array 202 is equal to the voltage on the bitline 213 of the first memory array 201. The diode connected PMOS transistor 424 is coupled between a supply voltage node and the bitline 213 of the second memory array 202 for detecting the leakage current on the bitline 213 of the second memory array 202 drawn by the unselected memory cells 210 of the second memory array 202.

The current source 420 comprises of plurality of PMOS transistors 426 that are coupled to a respective bitline 213 of the first memory array 201. The gates of the PMOS transistors 426 are coupled to the drain of the PMOS transistor 424 to mirror the current of the PMOS transistor 424 and thus to mirror the leakage current of the bitline 213 of the second memory array 202.

In an alternative embodiment, the current source 420 and the PMOS transistor 424 may be arranged on the output side of column multiplexer 230.

Figure 5:
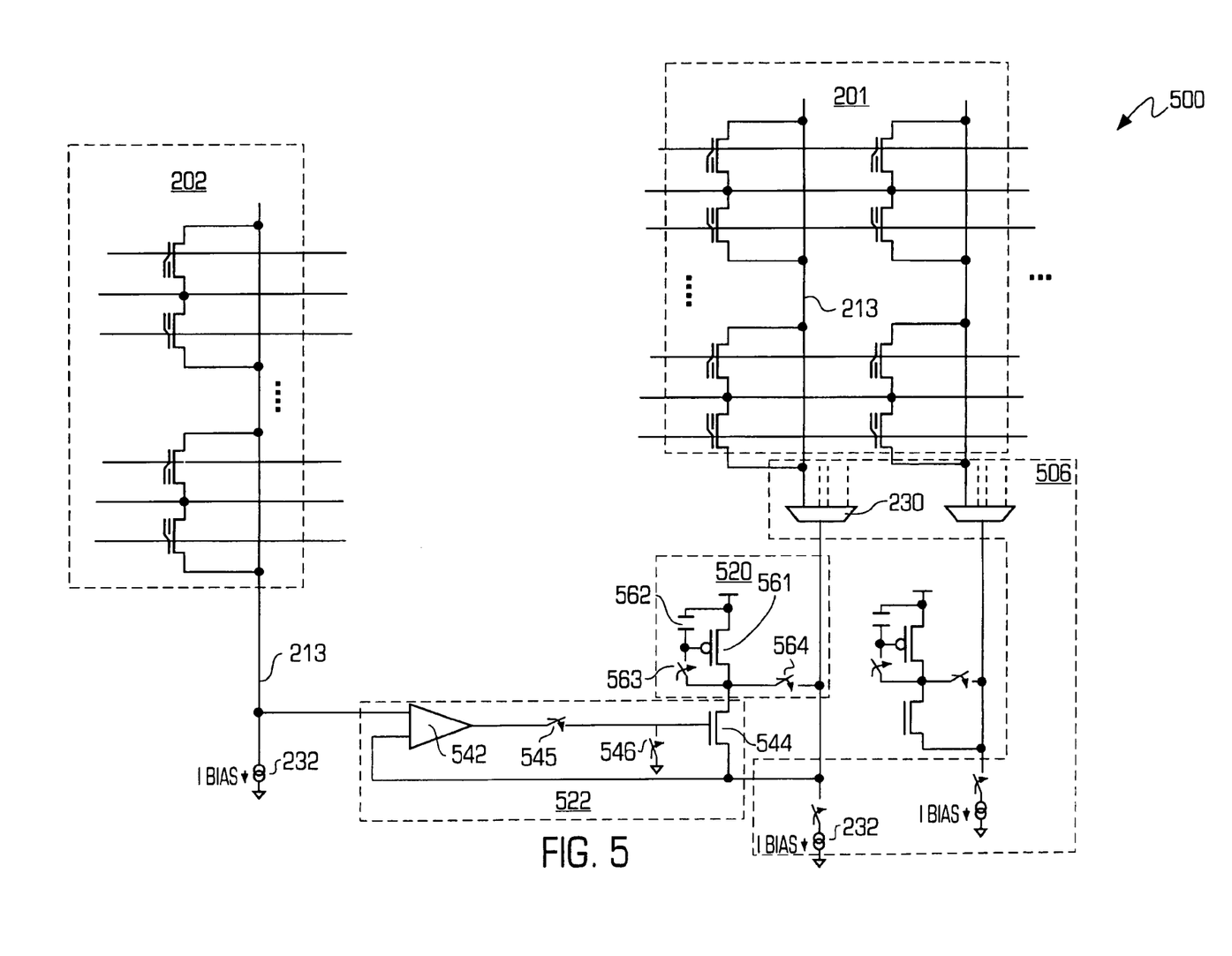
FIG. 5 is a block diagram illustrating a memory system that includes a non-systematic bitline leakage current circuit.

FIG. 5 is a block diagram illustrating a memory system 500.

The memory system 500 compensates for both systematic and non-systematic bitline leakage currents. The memory system 500 detects leakage current on a plurality of bitlines in an operational memory array during a sampling period and holds the currents for application to the bitlines during programming operations. The memory system 500 samples the leakage current of a bitline in an operational memory array during a sampling operation, and holds a voltage indicative of the leakage current for generating a compensation current for the leakage current during programming operations.

The memory system 500 comprises a first memory array 201, the second memory array 202, a column multiplexer circuit 506, a current source 520, and a voltage source 522. The voltage source 522 detects the voltage on a bitline 213 of the second memory array 202, which may be a non-operational array or a dummy array. The voltage source 522 sets the voltage on the bitline 213 of the first memory array 201 to be equal to the voltage on the bitline 213 of the second memory array 202. The current source 520 provides a current to the voltage source 522 that is indicative of the leakage current on the bitline 213 of the first memory array 201. Further, the current source 520 stores an indication of the leakage current. During an operational mode, such as a programming mode, the voltage source 522 is disabled and the current indicative of the stored indication (e.g., a voltage) of the leakage current is applied to the bitline 213 of the first memory array 201.

The column multiplexer circuit 506 comprises a plurality of multiplexers 230, a plurality of bias current sources 232, and a plurality of switches 565. The switch 565 is opened during a sample mode to disconnect the bias source 232 on the bitline 213 and is closed during programming operations to bias the memory cells.

The voltage source 522 comprises an operational amplifier 542, an NMOS transistor 544, and a plurality of switches 545 and 546. The drain-source terminals of the NMOS transistor 544 couple the current source 520 to the bitline 213 of the first memory array 201 to control the voltage on the bitline 213 of the first memory array 201 in response to the output of the operational amplifier 542 that matches the voltages on the bitlines 213 of the first and second memory arrays 201 and 202, respectively, in the event that the switch 545 is closed. The switch 546 selectively grounds the gate of the NMOS transistor 544 to disable the transistor 544. During a sample mode, the sample switch 545 is closed and the hold switch 546 is open. In a hold mode, the sample switch 545 is open and the hold switch 546 is closed.

The current source 520 comprises a PMOS transistor 561, a capacitor 562, and a plurality of switches 563 and 564. The current source 520 selectively provides current to either the NMOS transistor 544 or the bitline 213 of the first memory array 201. In a sampling mode, the switch 564 is open and the switch 563 is closed to diode connect the PMOS transistor 561. In the sampling mode, the holding capacitor 562 is charged so that in the event that the switch 563 is open the holding capacitor 562 maintains the gate-source voltage (Vgs) so that the PMOS transistor 561 provides a current indicative of the leakage of the memory cells 210 on the bitline 213 of the first memory array 201 during an operational mode.

The memory system 500 uses a sample and hold operation to compensate for both systematic and non-systematic bitline leakage current. During a sampling period, the bitline of the non-operational memory array (e.g., a second memory array 202) receives a programming pulse to measure the voltage which appears on the bitline 213 of the second memory array 202 during programming. During the sampling period, the switches 545 and 563 are closed. The operational amplifier 542 measures the voltage on the bitline 213 of the second memory array 202 and controls the gate of the NMOS transistor 544 so that the voltage on the source of the NMOS transistor 544 (and consequently the second input of the operational amplifier 542 and the bitline 213 of the first memory array 201) to be equal in real time to the voltage measured on the bitline 213 of the second memory array 202. During the sampling mode, the PMOS transistor 564 measures the bitline leakage current on the bitline 213 of the first memory array (which is the operational memory array). The capacitor 562 stores the bitline leakage current as the source to gate voltage of the PMOS transistor 561.

During the programming operation of the first memory array 201, the hold function of the current source is used. During the programming, a high voltage programming pulse is applied to the bitline 213 of the first memory array 201 and the switches 546, 564, and 565 are closed so that the PMOS transistor 561 provides the sampled and held bitline leakage current to the operational bitline 213 to thereby provide the bitline leakage current instead of this current being provided by the memory cell.

Figure 6:
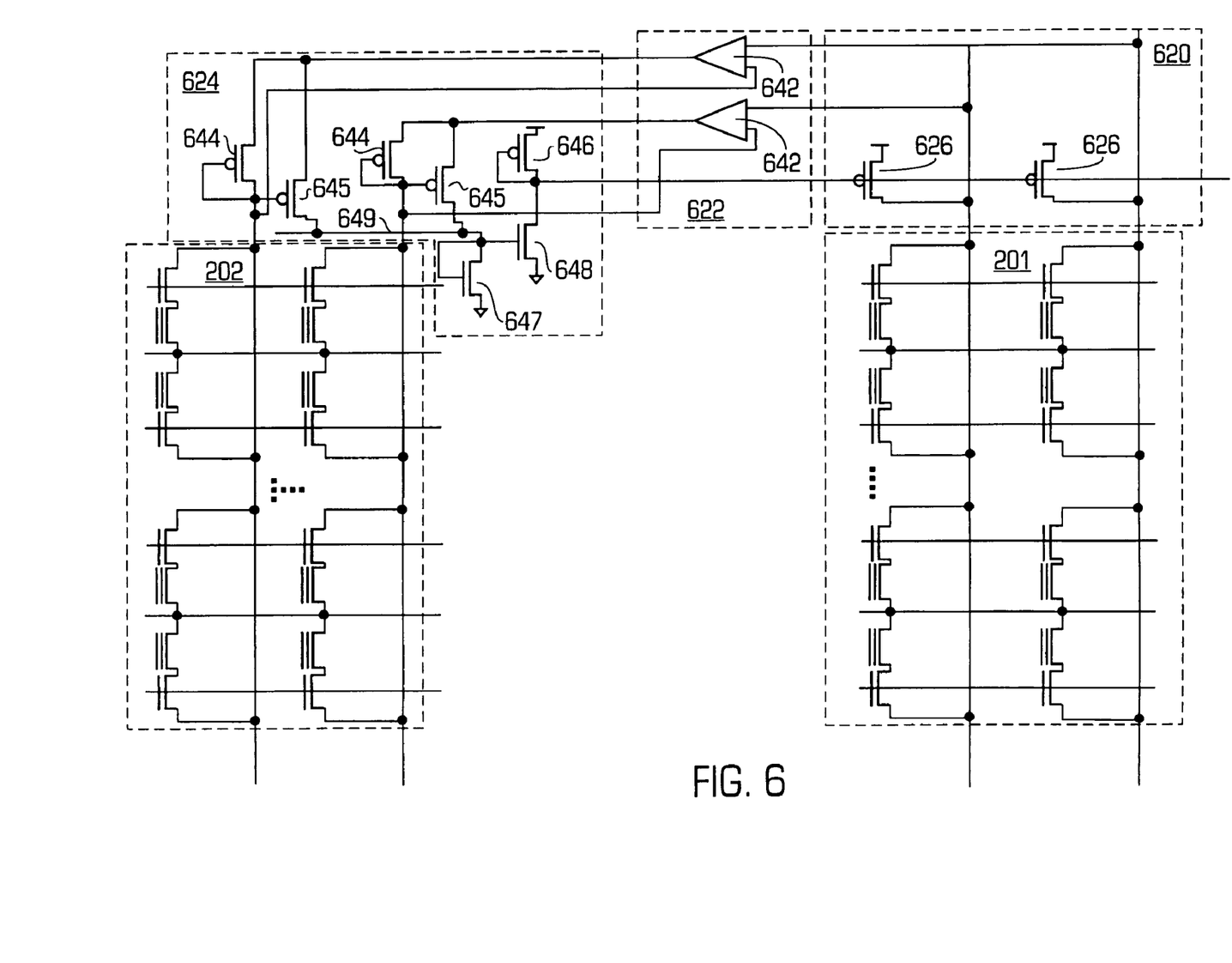
FIG. 6 is a block diagram illustrating a memory system that includes an averaging bitline leakage current circuit.

FIG. 6 is a block diagram illustrating a memory system 600.

The memory system 600 provides bitline leakage current compensation using an averaging of leakage currents of a plurality of bitlines. The memory system 600 comprises a first memory array 201, a second memory array 202, a column multiplexer circuit 206 (not shown), a current source 620, a voltage source 622, and a current detector 624. The current source 620 functions as a source of the bitline leakage compensation current in a similar manner as the current source 220 of the memory system 200 (FIG. 2). The voltage source 622 functions in a similar manner as the voltage source 222 of the memory system 200 (FIG. 2), but further detects the voltage on a plurality of bitlines 213 of the first memory array 201 to control the voltage on the bitlines 213 of the second memory array 202 to be equal to the voltage on the bitlines 213 of the first memory array 201. The voltage source 622 comprises a plurality of operational amplifiers 642. Each operational amplifier 642 includes first and second inputs that are coupled to the bitlines 213 of the first memory array 201 and the second memory array 202, respectively, and the output of the operational amplifier 642 is coupled to an input of the current detector 624.

The current detector 624 comprises a plurality of PMOS transistor 644, 645 and 646 and a plurality of NMOS transistor 647 and 648. Each of the diode connected PMOS transistors 644 includes drain-source terminals coupled between the output of a corresponding operational amplifier 642 of the voltage source 622 and a bitline 213 of the second memory array 202. Each of the PMOS transistors 645 includes drain-source terminals coupled between the output of a corresponding operational amplifier 642 and a node 649 and includes a gate coupled to the drain of the corresponding PMOS transistor 644 to form a current mirror with the current provided by the PMOS transistor 644. The diode connected NMOS transistor 647 includes drain-source terminals coupled between the node 649 and ground. The gate of the NMOS transistor 648 is coupled to the node 649. The diode connected PMOS transistor 646 and the NMOS transistor 648 include drain-source terminals coupled between the supply voltage and ground. The NMOS transistor 647 is designed to have a multiplier M indicative of the number of PMOS transistors 644, and thus, the number of bitlines 213 being measured. The NMOS transistor 648 has characteristics that are 1/N of the NMOS transistor 647. Thus, the currents through all of the PMOS transistor 644 are mirrored onto the node 649 and summed so that the total current is divided by the number of bitlines 213 to provide a mirrored average current by the PMOS transistor 646 and the NMOS transistor 648. The drain of the PMOS transistor 646 is coupled to the current source 620. In an another embodiment, the division factor N may be varied to modulate the bitline leakage current.

The voltage source 620 comprises a plurality of PMOS transistors 626 that each include drain-source terminals coupled between a supply voltage and a corresponding bitline 213 of the first memory array 201, and include a gate coupled to the drain of the PMOS transistor 646 to mirror the current from the PMOS transistor 646. The mirrored current provided by the PMOS transistor 626 to the bitline 213 of the first memory array 201 is a compensation current that is determined as an average of the measured leakage current of a plurality of bitlines 213 in the second memory array 202.

Figure 7:
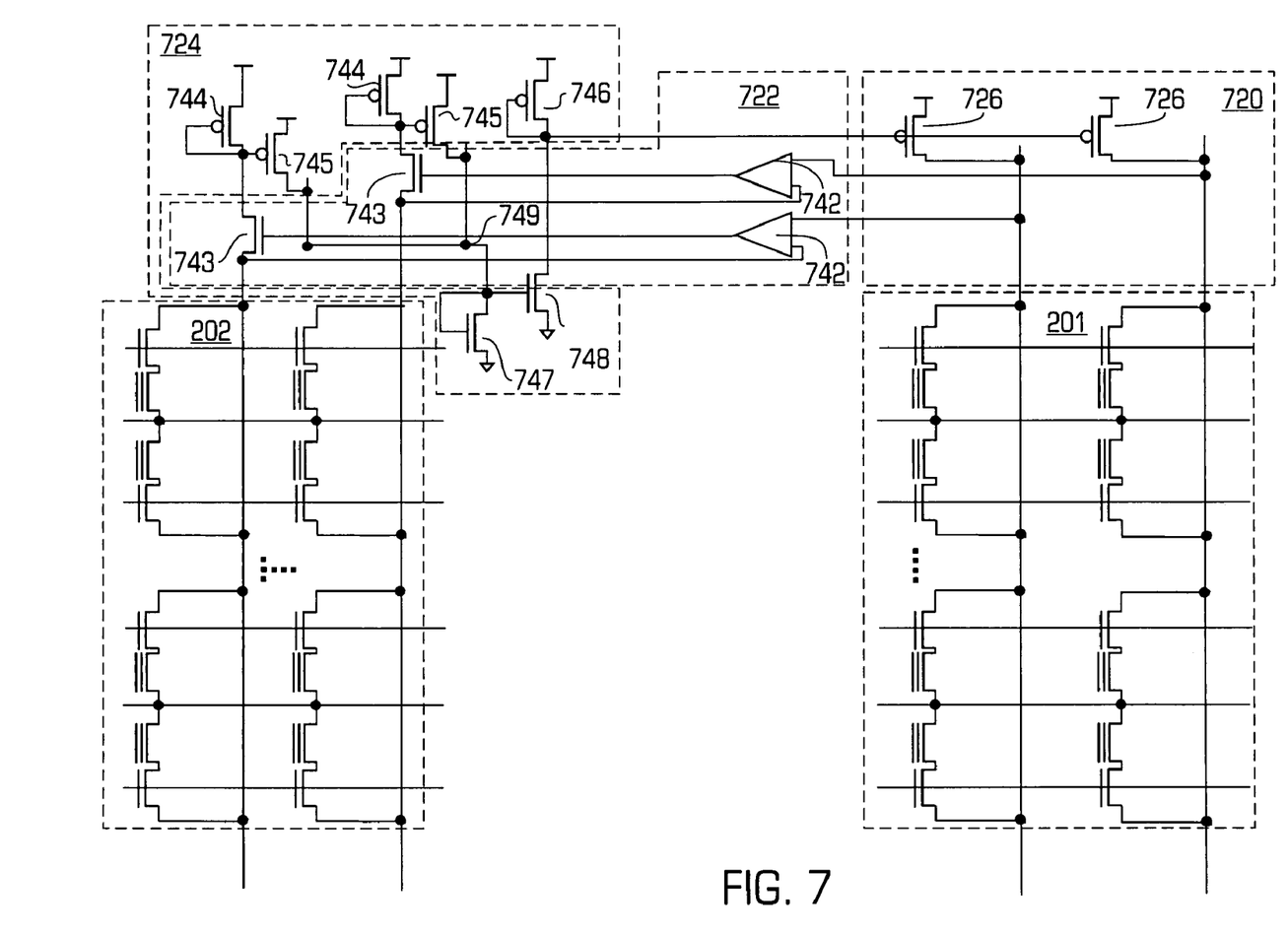
FIG. 7 is a block diagram illustrating a second embodiment of a memory system that includes an averaging bitline leakage current circuit.

FIG. 7 is a block diagram illustrating a memory system 700.

The memory system 700 provides a bitline leakage current compensation based on an averaging of the bitline leakage currents from a plurality of bitlines in a non-operational memory array. The memory system 700 comprises a first memory array 201, a second memory array 202, a column multiplexer circuit 206 (not shown), a current source 720, a voltage source 722, and a current detector 724. The current source 720 functions as a source of the leakage compensation current in a similar manner as the current source 220 of the memory system 200 (FIG. 2). The voltage source 722 functions in a similar manner as the voltage source 222 of the memory detector 200 (FIG. 2) further detects the voltage on a plurality of bitlines 213 of the first memory array 201 to control the voltage on the bitlines 213 of the second memory array 202 to be equal to the voltages on the bitline 213 of the first memory array 201. The voltage source 722 comprises a plurality of operational amplifiers 742 and a plurality of NMOS transistors 743 that are arranged in a similar manner as the operational amplifier 422 and the NMOS transistor 444, respectively, of the voltage detector 422 of the memory system 400 (FIG. 4). Each operational amplifier 742 and NMOS transistor 743 are coupled to a corresponding bitline 213 of the second memory array 202 to control the voltage on the source of the NMOS transistor 743, which is coupled to the bitline 213 of the second memory array 202, to be equal to the voltage on the corresponding bitline 213 of the first memory array 201. Accordingly, the voltage source 722 controls the voltage on a plurality of bitlines 213 of the second memory array 202.

The current detector 724 comprises a plurality of diode connected PMOS transistors 744 that are arranged in a similar manner as the diode connected PMOS transistor 424 of the memory system 400 (FIG. 4) to detect the current on the bitline. The current detector 724 further comprises a plurality of PMOS transistor 745 and 746 and a plurality of NMOS transistor 747 and 748 that are arranged in a similar manner as the PMOS transistors 644 and 645 and the NMOS transistors 647 and 648, respectively, of the current detector 624 of the memory system 600 (FIG. 6). The NMOS transistor 747 is designed to having multiplier N indicative of the number of PMOS transistors 744, and thus the number of bitlines 213 being measured. The NMOS transistor 748 has characteristics that are 1/N of the NMOS transistor 747. Thus, the currents through the PMOS transistor 744 are mirrored on to a node 749 and summed so that the total current is divided by the number of bitlines 213 to provide a mirrored average current by the PMOS transistor 746 and the NMOS transistor 748.

The current source 720 comprises a plurality of PMOS transistors 726 that are arranged in a similar manner as the PMOS transistor 626 of the current source 620 of the memory system (memory system 600 (FIG. 6)) to mirror the current from PMOS transistor 746. The mirrored current provided by the PMOS transistor 726 to the bitline 213 in the first memory array is a compensation current that is determined as an average of the measured leakage current of a plurality of bitlines 213 in the second memory array 202.

Figure 8:
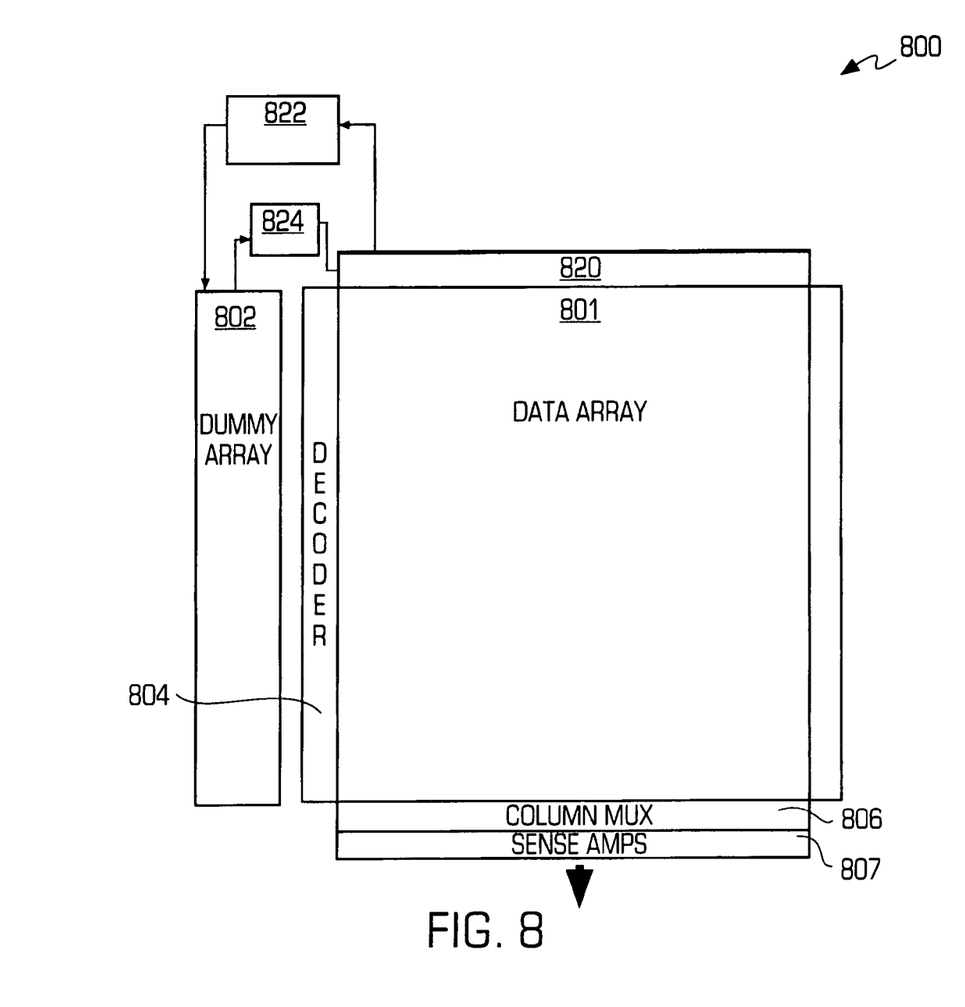
FIG. 8 is a block diagram illustrating an architecture of a first embodiment of a memory system that includes a bitline leakage current circuit.

FIG. 8 is a block diagram illustrating a first embodiment of architecture of a memory system 800 with a bitline leakage current compensation circuit.

The memory system 800 comprises a data array 801, a dummy array 802, an x decoder 804, a column multiplexer circuit 806, a sense amplifier circuit 807, a current source 820, a voltage source 822, and a current detector 824. The current source 820, the voltage source 822, and the current detector 824 function in a similar manner as the respective current source 220, the voltage source 222, and the current detector 224 of the memory system 200 (FIG. 2). The voltage source 822 measures the bitline voltage from the data array 801 and controls the voltage on the bitline of the dummy array 802 to be equal. The current detector 824 measures the leakage current on the bitlines from the non-operational array or the dummy array 802. The current source 820 applies a current to the bitlines of the data array 801 in response to the measured leakage current of the current detector 824.

Figure 9:
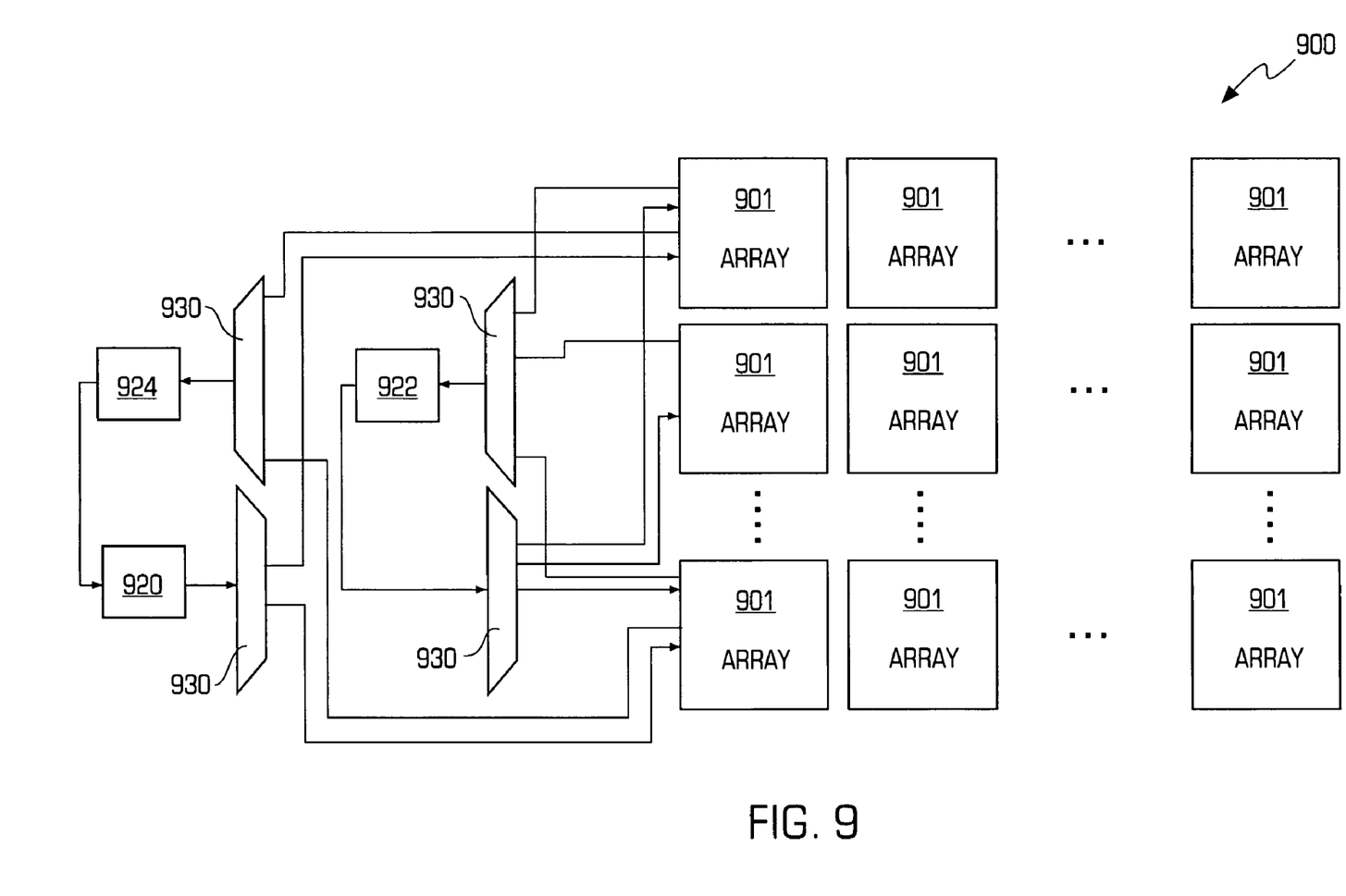
FIG. 9 is a block diagram illustrating an architecture of a second embodiment of a memory system that includes a bitline leakage current circuit.

FIG. 9 is a block diagram illustrating the architecture of a second embodiment of a memory system 900 including a bitline leakage current circuit.

The memory system 900 comprises a plurality of data arrays 901, a current source 920, a voltage source 922, a current detector 924, and a plurality of multiplexers 930. The current source 920, the voltage source 922, and the current detector 924 function in a similar manner as the current source 220, the voltage source 222, and the current detector 224, respectively, of the memory system 200 (FIG. 2). The multiplexers 930 couple selected memory arrays 901 that function as the operational array and others of the memory arrays 901 that function as the non-operational memory array to the current source 920, the voltage source 922, and the current detector 924 for detecting the leakage current in the non-operational memory arrays 901 for applying the compensation bitline leakage current to the operational memory arrays 901 in a manner similar to that described above.

Figure 10:
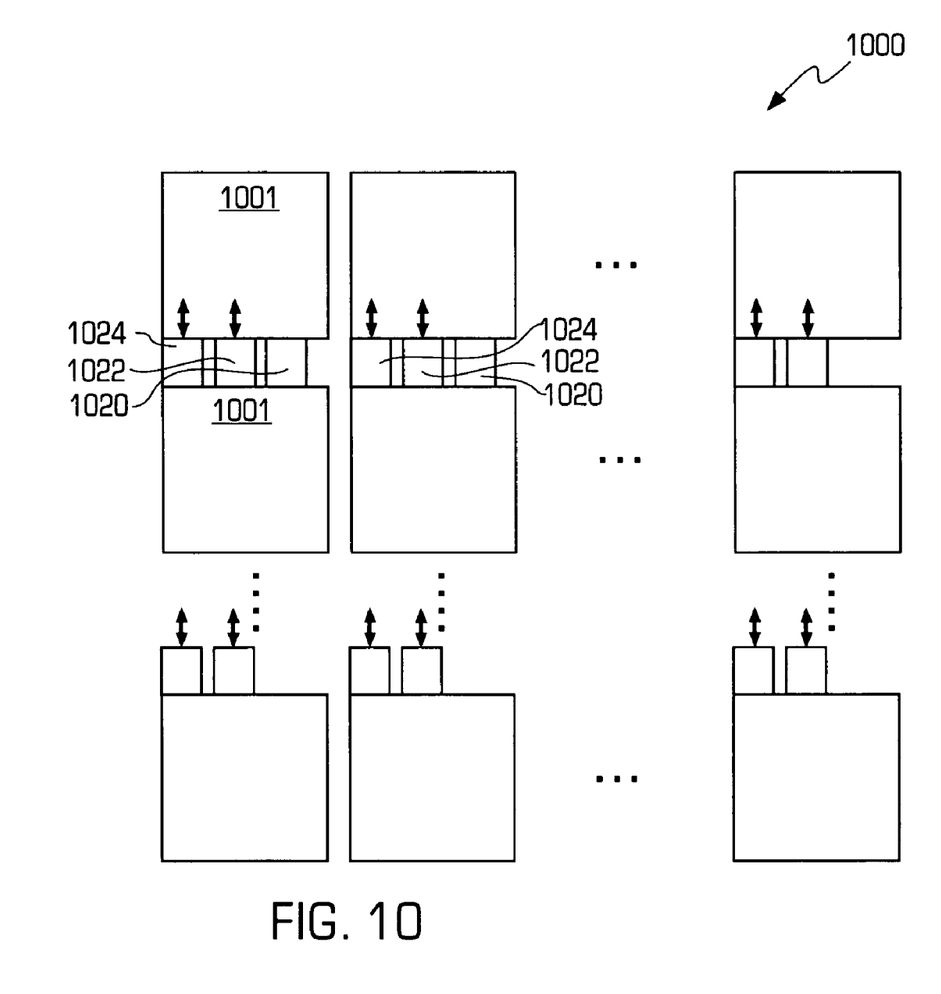
FIG. 10 is a block diagram illustrating an architecture of a third embodiment of a memory system that includes a bitline leakage current circuit.

FIG. 10 is a block diagram illustrating the architecture of a third embodiment of a memory system including a bitline leakage current circuit.

The memory system 1000 comprises a plurality of data arrays 1001, a plurality of current source 1020, a plurality of voltage source 1022, and a plurality of current detector 1024, The current source 1020, the voltage source 1022, and the current detector 1024 function in a similar manner as the current source 220, the voltage source 222, and the current detector 224, respectively, of the memory system 200 (FIG. 2). Each pair of memory arrays 1001 is coupled to a corresponding current source 1020, voltage source 1022, and current detector 1024. Each pair is controlled so that one memory array 1001 functions as an operational array and other functions as the non-operational memory array for detecting the leakage current in the non-operational memory arrays 1001 for applying the compensation bitline leakage current to the operational memory arrays 1001 in a manner similar to that described above.

The bitline leakage current compensation circuits described above may be used in various memory systems, such as nonvolatile memory, single level memory cells or multilevel memory cells.

In the foregoing description, various methods and apparatus, and specific embodiments are described. However it should be obvious to the one conversant in the art, various alternatives, modifications, and changes may be possible without departing from the spirit and the scope of the invention which is defined by the metes and bounds of the appended claims.

What is claimed is:

1. A method for compensating for bitline leakage in a memory system, the method comprising:
    detecting a first voltage on a bitline in a first memory array;
    applying a second voltage to a bitline in a second memory array, the second voltage having substantially the some amplitude as the first voltage;
    detecting a leakage current on the bitline of the second memory array;
    applying an incremental current to the bitlines of the first memory array substantially equal to the detected current during programming of the first memory array.

2. A memory comprising:
    a plurality of memory arrays, each memory array including a plurality of memory cells and including a plurality of bitlines, each of said plurality of bitlines being coupled to a corresponding group of said plurality of memory cells;
    a first circuit having an input coupled to a bitline of a first one of the memory arrays and having an output coupled to a bitline of a second one of the memory arrays to apply a voltage on said bitline of said second memory array equal to a voltage on said bitline of the first memory array during programming of said first memory array;
    a second circuit coupled to the bitline of the second memory array to measure current on said bitline; and
    a current source coupled to the bitline of the first memory array to provide a current thereto in response to the detected current on the bitline of the second memory array.

3. The memory of claim 2, wherein the first memory array is an operational memory array and said second memory array is a non-operational memory array.

4. The memory of claim 2, wherein the first memory array is an operational memory array and the second memory array is a dummy memory array.

5. The memory of claim 2, wherein the first circuit comprises an operational amplifier including a first input coupled to the bitline of the first memory array, including a second input coupled to the bitline of the second memory array, and including an output,
    wherein the second circuit comprises a first transistor including first and second terminals with a channel therebetween and including a gate for controlling current in said channel, said first terminal being coupled to the output of said operational amplifier, said second terminal being coupled to the bitline of the second memory array, said gate being coupled to said second terminal,
    wherein the current source comprises a second transistor including first and second terminals with a channel therebetween and including a gate for controlling current in said channel, said first terminal being coupled to the first terminal of the first transistor, said second terminal being coupled to the bitline of the first memory array, said gate being coupled to the second terminal of the first transistor.

6. The memory of claim 2,
    wherein the first circuit comprises an operational amplifier including a first input coupled to the bitline of the first memory array, including a second input coupled to the bitline of the second memory array, and including an output, and further comprises an NMOS transistor including first and second terminals with a channel therebetween and including a gate for controlling current in said channel, said second terminal being coupled to the bitline of the second memory array, said gate being coupled to the output of the operational amplifier,
    wherein the second circuit comprises a first PMOS transistor including first and second terminals with a channel therebetween and including a gate for controlling current in said channel, said first terminal being coupled to a supply voltage node, said second terminal being coupled to the first terminal of the NMOS transistor, said gate being coupled to said second terminal,
    wherein the current source comprises a second PMOS transistor including first and second terminals with a channel therebetween and including a gate for controlling current in said channel, said first terminal being coupled to the supply voltage node, said second terminal being coupled to the bitline of the first memory array, said gate being coupled to the second terminal of the first PMOS transistor.

7. The memory of claim 2,
    wherein said first circuit has a plurality of second outputs coupled to a corresponding bitline of said second memory array to apply a voltage on said corresponding bitline of said second memory array equal to said voltage on said bitline of the first memory array,
    wherein said second circuit is coupled to said corresponding bitlines of the second memory array to measure current on said corresponding bitlines, and
    wherein said current source provides said current to the bitline of the first memory array in response to the detected currents on the bitlines of the second memory array.

8. The memory of claim 7,
    wherein said first circuit comprises a plurality of operational amplifiers and a plurality of first NMOS transistors, each operational amplifier includes a first input coupled to a corresponding bitline of the first memory array, including a second input coupled to a corresponding bitline of the second memory array, and including an output, each NMOS transistor includes first and second terminals with a channel therebetween and including a gate for controlling current in said channel, said second terminal being coupled to a corresponding bitline of the second memory array, said gate being coupled to the output of a corresponding operational amplifier, wherein the second circuit comprises a plurality of first PMOS transistors, a plurality of second PMOS transistors, a third PMOS transistor, a second NMOS transistor, and a third NMOS transistor, each of the first, second and third PMOS transistors and of the second and third NMOS transistors include first and second terminals with a channel therebetween and including a gate for controlling current in said channel, said first terminal of the first PMOS transistor being coupled to an output of a corresponding operational amplifier of the first circuit, said second terminal of the first PMOS transistor being coupled to a corresponding bitline of the second memory array, said gate of the first PMOS transistor being coupled to said second terminal, said first terminal of the second PMOS being coupled to the first terminal of the corresponding first PMOS transistor, said second terminal of the second PMOS being coupled to a summation node, said gate of the second PMOS being coupled to a second terminal of said corresponding first PMOS transistor, said first terminal of the third PMOS transistor being coupled to a supply voltage node, said second terminal of the third PMOS transistor being coupled to said gate of the third PMOS transistor, said first terminal of the second NMOS transistor being coupled to the summation node, said second terminal of the second NMOS transistor being coupled to a ground node, said gate of the second NMOS transistor being coupled to said first terminal of the second NMOS transistor, said first terminal of the third NMOS transistor being coupled to the second terminal of the third PMOS transistor, said second terminal of the third NMOS transistor being coupled to the ground node, said gate of the third NMOS transistor being coupled to the first terminal of the second NMOS transistor, said second NMOS transistor having a multiplier relative to the third NMOS transistor substantially equal to the number of second PMOS transistors in said second circuit, wherein the current source comprises a plurality of fourth PMOS transistors.

9. A memory comprising:

a plurality of memory arrays, each memory array including a plurality of memory cells and including a plurality of bitlines, each of said plurality of bitlines being coupled to a corresponding group of said plurality of memory cells;

a current source having an output for providing a first current in a first mode and having a second output to provide a second current to a bitline of the first memory array in a second mode; and the detector having a first input coupled to a bitline of a second memory array, having a second input coupled to the first output of the current source to receive said first current and having an output coupled to said bitline of the first memory array to apply a voltage on the bitline of the first memory array substantially equal to the voltage on the bitline of the second memory ray in the first mode, the first and second currents being substantially equal and the first and second modes, respectively.

* * * * *